United States Patent
Li et al.

(10) Patent No.: US 12,532,555 B2
(45) Date of Patent: Jan. 20, 2026

(54) METHOD FOR PRODUCING A MULTIPIXEL DETECTOR

(71) Applicant: IMEC VZW, Leuven (BE)

(72) Inventors: Yunlong Li, Heverlee (BE); Deniz Sabuncuoglu Tezcan, Herent (BE); Pawel Malinowski, Heverlee (BE); Gauri Karve, Tervuren (BE)

(73) Assignee: IMEC VZW, Leuven (BE)

(*) Notice: Subject to any disclaimer, the term of this patent is extended or adjusted under 35 U.S.C. 154(b) by 469 days.

(21) Appl. No.: 18/068,775

(22) Filed: Dec. 20, 2022

(65) Prior Publication Data
US 2023/0197761 A1    Jun. 22, 2023

(30) Foreign Application Priority Data
Dec. 22, 2021    (EP) .................................... 21216902

(51) Int. Cl.
*H10F 39/00*    (2025.01)
*H10K 39/32*    (2023.01)

(52) U.S. Cl.
CPC ......... *H10F 39/026* (2025.01); *H10F 39/014* (2025.01); *H10F 39/016* (2025.01); *H10K 39/32* (2023.02)

(58) Field of Classification Search
None
See application file for complete search history.

(56) References Cited

U.S. PATENT DOCUMENTS

| | | |
|---|---|---|
| 8,035,184 B1 | 10/2011 | Dutta et al. |
| 8,828,649 B2 | 9/2014 | Bradley et al. |
| 9,685,634 B2 | 6/2017 | Huangfu et al. |
| 10,529,882 B2 | 1/2020 | Uzu et al. |
| 11,943,943 B2 * | 3/2024 | Kawata .................. H10F 39/198 |

(Continued)

FOREIGN PATENT DOCUMENTS

| | | |
|---|---|---|
| CN | 111029417 A | 4/2020 |
| JP | 2009238725 A | 10/2009 |

(Continued)

OTHER PUBLICATIONS

English machine translation of TW-I610112-B (Year: 2018).*

(Continued)

*Primary Examiner* — Yara B Green
*Assistant Examiner* — Erika H Son
(74) *Attorney, Agent, or Firm* — McDonnell Boehnen Hulbert & Berghoff LLP

(57) ABSTRACT

An example includes a method for producing a multipixel detector, the method including: providing a bottom layer including a first and a second bottom electrode, depositing an electrically insulating layer on the bottom layer, forming a first opening through the electrically insulating layer, depositing a first photon absorbing material in the first opening, forming a second opening through the electrically insulating layer, depositing a second photon absorbing material in the second opening, planarizing the deposited electrically insulating layer, the first photon absorbing material, and the second photon absorbing material to form a flat surface, and forming a common top electrode on top of the flat surface.

20 Claims, 7 Drawing Sheets

(56) References Cited

U.S. PATENT DOCUMENTS

2020/0365663 A1  11/2020  Kim et al.

FOREIGN PATENT DOCUMENTS

| TW | 200847413 A | | 12/2008 |
|---|---|---|---|
| TW | I610112 B | * | 1/2018 |

OTHER PUBLICATIONS

Extended European Search Report and Written Opinion, Application No. EP 21216902.3, mailed Jul. 1, 2022, 6 pages.

Heves, Emre, Cem Ozturk, Volkan Ozguz, and Yasar Gurbuz. "Solution-based PbS photodiodes, integrable on ROIC, for SWIR detector applications." IEEE Electron Device Letters 34, No. 5 (2013): 662-664.

Skorka, Orit, and Dileepan Joseph. "Reducing crosstalk in vertically integrated CMOS image sensors." In Sensors, Cameras, and Systems for Industrial/Scientific Applications XI, vol. 7536, pp. 200-212. SPIE, 2010.

Heo, Chul-Joon, Takao Motoyama, Gae Hwang Lee, Sungyoung Yun, Sungjun Park, Younhee Lim, Kiyohiko Tsutsumi et al. "Highly durable organic photodetector for complementary metal oxide semiconductor image sensors." Organic Electronics 95 (2021): 106154.

Baierl, Daniela, Morten Schmidt, Giuseppe Scarpa, Paolo Lugli, Lucio Pancheri, David Stoppa, and Gian-Franco Dalla Betta. "Towards a hybrid CMOS-imager with organic semiconductors as photoactive layer." In 2011 7th Conference on Ph. D. Research in Microelectronics and Electronics, pp. 89-92. IEEE, 2011.

* cited by examiner

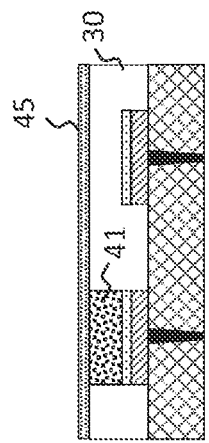
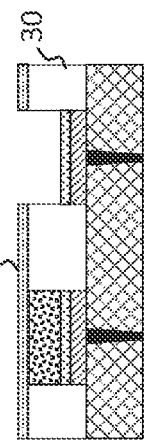
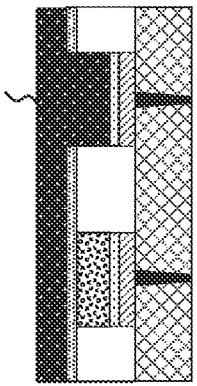
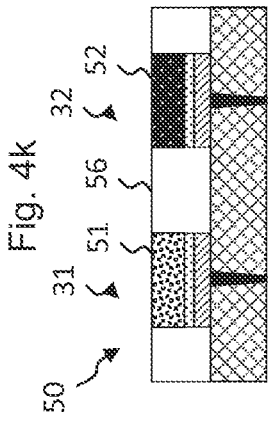
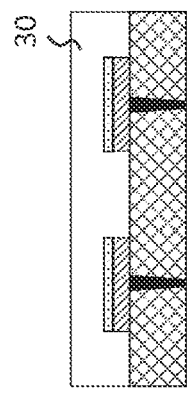
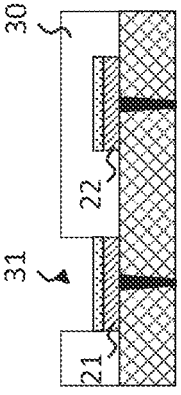
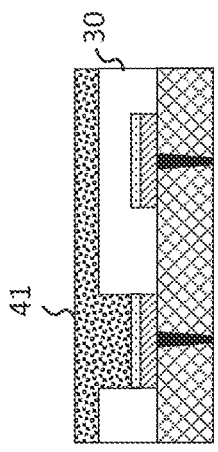
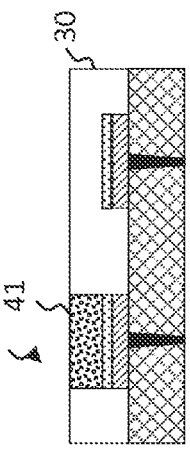
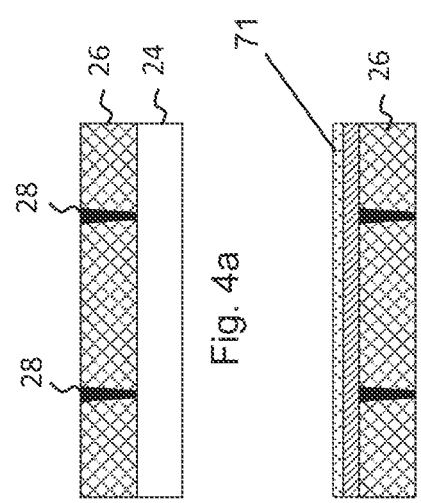
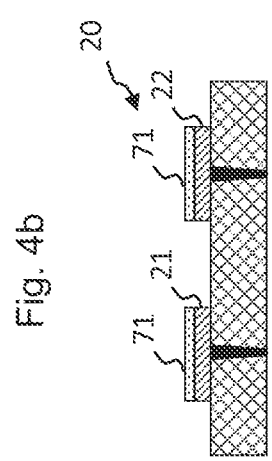
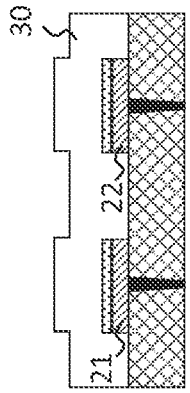

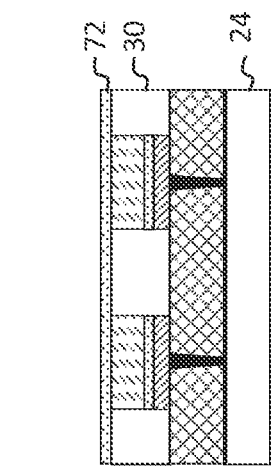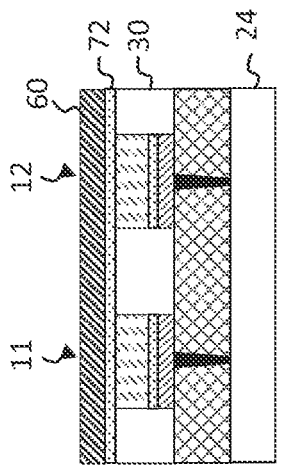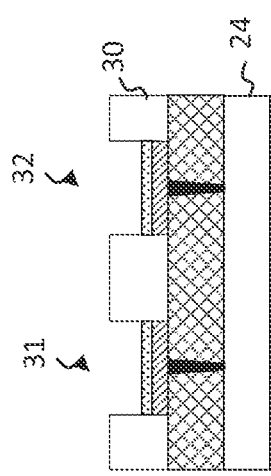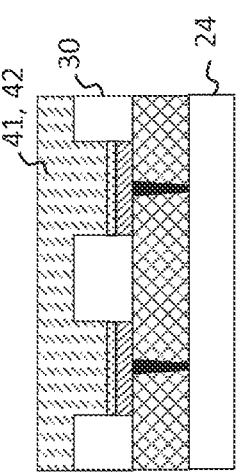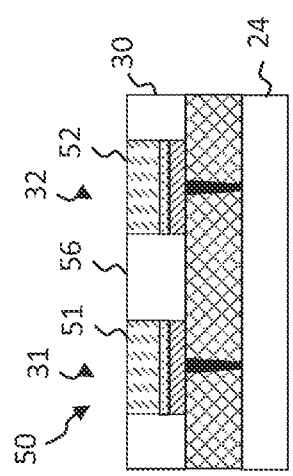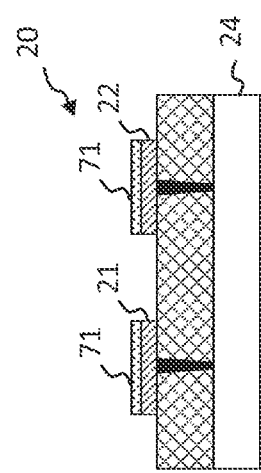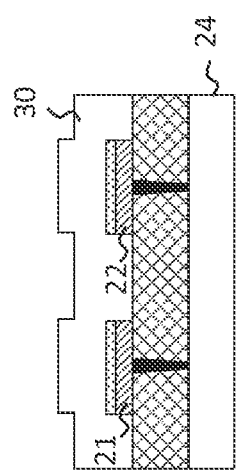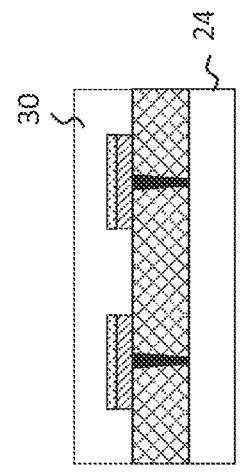

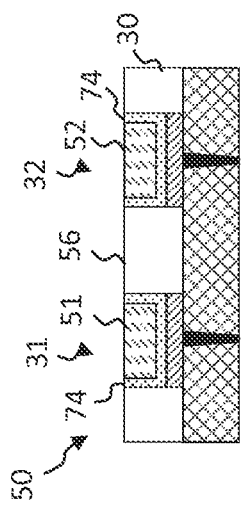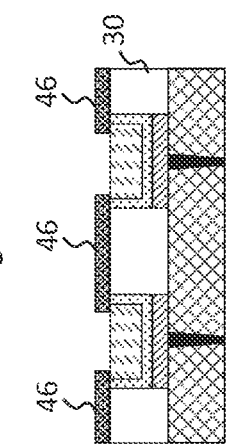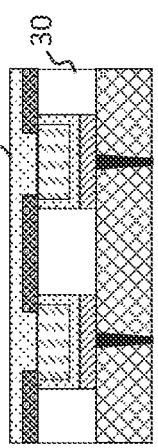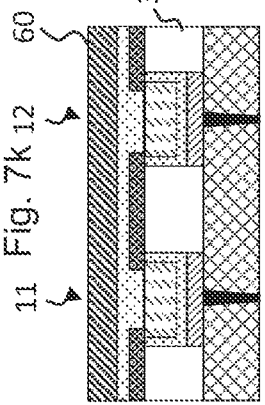
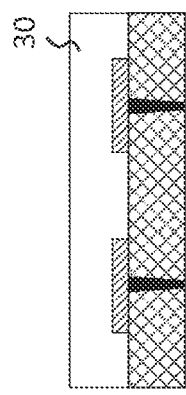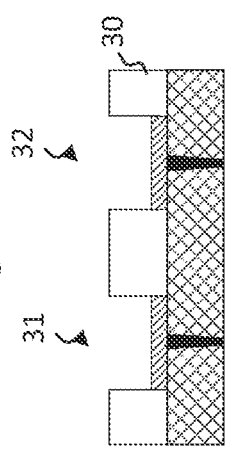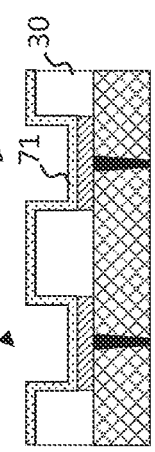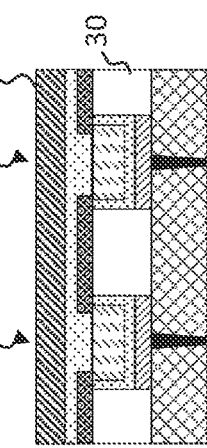
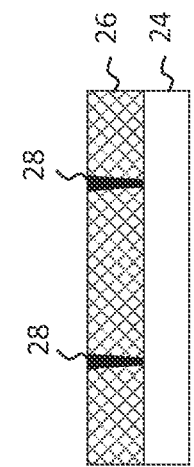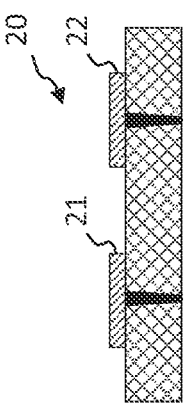

METHOD FOR PRODUCING A MULTIPIXEL DETECTOR

CROSS-REFERENCE TO RELATED APPLICATIONS

The present application is a non-provisional patent application claiming priority to European Patent Application No. 21216902.3, filed Dec. 22, 2021, the contents of which are hereby incorporated by reference.

FIELD OF THE DISCLOSURE

The present disclosure relates, in general, to a method for producing a multipixel detector.

BACKGROUND

A multipixel detector comprises several light sensitive pixels which detect light. Thus, a multipixel detector may detect an image projected on the multipixel detector. Each light sensitive pixel of the multipixel detector may be a photodiode. Thus, a multipixel detector may comprise an array of photodiodes. One type of photodiode is the thin film photodiode (TFPD). A TFPD comprises one or more thin film layers, wherein one of the thin film layers comprises a photon absorbing material.

SUMMARY

It is a potential benefit of the present disclosure to provide a cost-efficient method for producing multipixel detectors. It is a further potential benefit of the present disclosure to facilitate production of high-quality multipixel detectors. It is a further potential benefit of the present disclosure to prevent lithographically related damage and/or etch related damage of thin film material during the production process. It is a further potential benefit of the present disclosure to facilitate production of multipixel detectors with few defective pixels, e.g. to facilitate production of multipixel detectors with few electrically shorted pixels.

According to a first aspect there is provided a method for producing a multipixel detector, the method comprising: providing a bottom layer comprising a first and a second bottom electrode; depositing an electrically insulating layer on the bottom layer; forming a first opening through the electrically insulating layer to the first bottom electrode; depositing a first photon absorbing material in the first opening to electrically connect to the first bottom electrode; forming a second opening through the electrically insulating layer to the second bottom electrode; depositing a second photon absorbing material in the second opening to electrically connect to the second bottom electrode; planarizing the deposited electrically insulating layer, the deposited first photon absorbing material, and the deposited second photon absorbing material to form a flat surface, wherein the flat surface comprises a top surface of the electrically insulating layer, a top surface of the first photon absorbing material in the first opening and a top surface of the second photon absorbing material in the second opening, separated from the top surface of the first photon absorbing material by the top surface of the electrically insulating layer; forming a common top electrode on top of the flat surface, wherein the common top electrode electrically connects to the top surfaces of the first and second photon absorbing materials in the flat surface; wherein the common top electrode, the first photon absorbing material in the first opening and the first bottom electrode form parts of a first thin film photodiode, first TFPD; and the common top electrode, the second photon absorbing material in the second opening and the second bottom electrode form parts of a second thin film photodiode, second TFPD.

The first and second TFPDs may herein respectively function as first and second pixels of the multipixel detector.

According to the disclosure, the multipixel detector comprises thin film photodiodes. Such photodiodes can be produced in a cost-efficient manner, e.g. in a more cost-efficient manner than thick film single crystalline p-n junctions. Thus, cost-efficient production of the multipixel detector is facilitated by the use of thin film photodiodes. Further, thin film photodiodes may be used in the short-wave infrared wavelength region, e.g. between 1.2 µm and 1.7 µm. Silicon based photodiodes may not be compatible with this wavelength range and devices comprising thick film single crystalline p-n junctions of other materials, such as e.g. InAs, may be expensive.

It is a realization that cost-efficient production is further facilitated when the production method for the multipixel detector is compatible with complementary metal—oxide—semiconductor (CMOS) production methods. CMOS production facilities are abundant.

The method provides a high-quality multiple pixel detector as damage to and/or degradation of the photon absorbing material during processing may be avoided or reduced. In a multipixel detector, the photon absorbing material of each pixel should be separated from the photon absorbing material of the other pixels. If photon absorbing material for a thin film photodetector is lithographically patterned and etched to form separate pixels, as done in the prior art, the photon absorbing material may be damaged and/or degrade. The photon absorbing material may e.g. degrade due to lithographically related damage or due to etch related damage. Lithographic related damage may be damage caused by heat or radiation from the lithographic patterning process, e.g. heat or irradiation from UV-light exposure. Etch related damage may be formation of recombination centers on etched surfaces of the photon absorbing material. It is unfortunate that lithographic patterning and etching, which are commonly used in CMOS production, may cause damage to the photon absorbing material. However, when the first and second photon absorbing materials are deposited in the respective first and second openings in the electrically insulating layer, the first and second photon absorbing materials may be patterned and thereby separated by planarizing the electrically insulating layer, the first photon absorbing material, and the second photon absorbing material.

The position and size of the respective first and second openings may define the position and size of the respective first and second TFPDs. The position and size of the respective first and second openings (and thus of the first and second TFPDs) may be defined when the first and second openings are formed. Forming the first and second openings may be done through lithographic patterning and etching of the electrically insulating layer. However, as some or all of the lithographic patterning and etching steps are performed before depositing photon absorbing material in the openings, degradation of the photon absorbing material may be avoided or reduced.

Further, damage to the photon absorbing material during formation of top electrodes may be avoided as a common top electrode is formed on top of the flat surface. Thus, instead of lithographic patterning and etching individual top electrodes, a common top electrode may be used.

Further, the method enables use of a common top electrode on top of the flat surface with a reduced risk of electrically shorted pixels, and thereby facilitates production of multipixel detectors with few defective pixels. The formation of such a common top electrode may ensure that there is a sufficient distance and electrical insulation between the top and bottom electrodes associated with a pixel to prevent short circuits which may result in a defective pixel.

Further, a common top electrode may result in a flat top surface. A flat top surface may be beneficial in many applications. For example, if the multipixel detector is used as part of a focal plane array, a flat top surface enables focal plane array processing on top of the multipixel detector.

Further, the method can provide a high-quality multiple pixel detector as degradation of the photon absorbing material in the finished multipixel detector may be avoided or reduced. Depositing the photon absorbing materials in openings in the electrically insulating layer may protect the photon absorbing materials against coming in contact with the ambient air, e.g. against humidity in the ambient air. In the finished multipixel detector, the photon absorbing materials may be completely surrounded by the electrically insulating layer, the bottom electrode, and the common top electrode.

Due to the nature of the deposition process, the first and second photon absorbing materials may be in contact with each other before the planarization. The planarization then forms a flat surface wherein the top surface of the second photon absorbing material is laterally separated from the top surface of the first photon absorbing material by the top surface of the electrically insulating layer, such that the first and second photon absorbing materials are separated from each other. In other words, when photon absorbing material is deposited in an opening, there may also be photon absorbing material deposited on the top surface of the electrically insulating layer. The photon absorbing material on the top surface of the electrically insulating layer may then be removed by the planarization. Planarizing the deposited electrically insulating layer, the deposited first photon absorbing material and the deposited second photon absorbing material may comprise chemical-mechanical polishing, grinding, and/or fly-cutting.

The multipixel detector may comprise more than a first TFPD and a second TFPD. The multipixel detector may comprise an array of TFPDs. The array of TFPDs may be one-dimensional, e.g. comprise a single row of TFPDs, or two-dimensional, e.g. comprise rows and columns of TFPDs. The multipixel detector may be part of an imaging device.

As will be described further below, the first and second photon absorbing materials may be, or comprise, the same material or different materials, e.g. materials with different absorption peak wavelengths. The first and second openings may be formed simultaneously or separately. The first and second photon absorbing materials may be deposited simultaneously or separately.

The first and second photon absorbing materials may have the same thickness or different thicknesses. For example, the thickness of the first and/or second photon absorbing materials may depend on the quantum efficiency of the photon absorbing material.

The common top electrode may be at least partially transparent to light.

Each pixel of the multipixel detector, e.g. each of the first and second pixels, may be configured to absorb a photon, such as a photon which has passed through a transparent common top electrode, by the photon absorbing material and thereby generate a photogenerated electron-hole pair in the photon absorbing material. Thus, each TFPD of the multipixel detector may be configured to absorb photons. Each TFPD of the multipixel detector may be configured to separate the electron and the hole of the photogenerated electron-hole pair and either: in a so called "hole to read-out" (h2ro) configuration, deliver the hole to the bottom electrode for read-out and the electron to the common top contact, or in a so called "electron to read-out" (e2ro) configuration, deliver the electron to the bottom electrode for read-out and the hole to the common top contact.

The first and second TFPDs may each comprise a bottom charge carrier control layer between the photon absorbing material and the bottom electrode and/or a top charge carrier control layer between the photon absorbing material and the common top electrode, wherein each of the bottom and top charge carrier control layers of the first and second TFPDs comprise at least one of: an electron transport layer, a hole transport layer, an electron blocking layer, a hole blocking layer, an electron injection layer, or a hole injection layer.

The charge carrier control layers may be configured to facilitate separation of electrons and holes of photogenerated electron-hole pairs. This may be done by tuning (or bridging) the work function of the bottom electrode with respect to the work function of the photon absorbing material and/or tuning (or bridging) the work function of the common top electrode with respect to the work function of the photon absorbing material.

An electron transport layer may be a layer configured to enhance electron transport from the photon absorbing material to the adjacent electrode.

A hole transport layer may be a layer configured to enhance hole transport from the photon absorbing material to the adjacent electrode.

An electron blocking layer may be a layer configured to block electron transport from the photon absorbing material to the adjacent electrode.

A hole blocking layer may be a layer configured to block hole transport from the photon absorbing material to the adjacent electrode.

An electron injection layer may be a layer configured to enhance electron injection to the photon absorbing material.

A hole injection layer may be a layer configured to enhance hole injection to the photon absorbing material.

The bottom charge carrier control layer and top charge carrier control layer may be configured to promote transport of opposite types of charge carriers. As an example, if the bottom charge carrier control layer is an electron transport layer, the top charge carrier control layer may be a hole transport layer. As another example, if the bottom charge carrier control layer is a hole transport layer, the top charge carrier control layer may be an electron transport layer.

The method may further comprise depositing a bottom charge carrier control layer in the first opening before depositing the first photon absorbing material in the first opening, such that the first bottom electrode and side walls of the first opening are covered by the bottom charge carrier control layer, and/or depositing a bottom charge carrier control layer in the second opening before depositing the second photon absorbing material in the second opening, such that the second bottom electrode and side walls of the second opening are covered by the bottom charge carrier control layer.

When the bottom charge carrier control layer is deposited in an opening through the electrically insulating layer, the bottom charge carrier control layer may not need to be lithographically patterned and etched. Thus, lithographically related damage and/or etch related damage to the bottom charge carrier control layer may be avoided or reduced, in analogy to the above discussion related to the photon absorbing material.

To illustrate, the first and second bottom electrodes may first be formed by depositing a layer of electrode material, e.g. metal. The layer of electrode material may then be patterned and etched into the first and second bottom electrodes after which the electrically insulating layer is deposited, the openings formed, and the bottom charge carrier control layer is deposited in an opening. Thus, the bottom charge carrier control layer may not need to be subjected to the patterning and etching of the layer of electrode material.

To cover side walls of an opening, the bottom charge carrier control layer may be deposited with a conformal depositing technique.

When a bottom charge carrier control layer is deposited in an opening, the method may further comprise forming an electrically insulating barrier on the flat surface formed by planarizing the deposited electrically insulating layer, the deposited first photon absorbing material, and the deposited second photon absorbing material, the electrically insulating barrier covering a part of a bottom charge carrier control layer deposited in the first or second opening, wherein the covered part of the bottom charge carrier control layer lies within the flat surface.

Planarizing the deposited electrically insulating layer, the deposited first photon absorbing material, and the deposited second photon absorbing material may also include planarizing parts of the bottom charge carrier control layer which have been deposited on the top surface of the electrically insulating layer and thereby remove those parts. However, after planarization there may be parts of the bottom charge carrier control layer within the flat surface. If a top charge carrier control layer or a common top electrode is deposited onto such parts of the bottom charge carrier control layer within the flat surface, charge carriers may bypass the photon absorbing material and a defective pixel may be formed. Thus, it may be beneficial to provide an electrically insulating barrier covering the part of a bottom charge carrier control layer that lies within the flat surface. Thereby, defective pixels may be avoided or reduced. In particular, when depositing a common top electrode afterwards, the electrically insulating barrier may provide electrical insulation between the common top electrode and the bottom charge carrier control layer, such that defective pixels may be avoided or reduced.

The method may, as an alternative or addition to depositing a bottom charge carrier control layer in an opening, comprise: providing a bottom charge carrier control layer on the first bottom electrode before depositing the electrically insulating layer; and/or providing a bottom charge carrier control layer on the second bottom electrode before depositing the electrically insulating layer.

Thus, as an alternative to depositing a bottom charge carrier control layer in an opening, the bottom charge carrier control layer may be provided on a bottom electrode before depositing the electrically insulating layer. For example, the bottom charge carrier control layer may be deposited onto the layer of electrode material and patterned and etched together with the layer of electrode material. The bottom charge carrier control layer may not necessarily be as sensitive to lithographically related damage and/or etch related damage as the photon absorbing layer, at least in some situations. Further, depositing the bottom charge carrier control layer before depositing the electrically insulating layer may simplify the processing of the multipixel detector.

The method may further comprise forming a common top charge carrier control layer configured such that the common top electrode electrically connects to the top surfaces of the first and second photon absorbing materials in the flat surface via the common top charge carrier control layer, wherein the common top charge carrier control layer is formed after planarizing the deposited electrically insulating layer, the deposited first photon absorbing material, and the deposited second photon absorbing material. Thus, damage to the photon absorbing material during formation of top charge carrier control layers may be avoided as a common top charge carrier control layer is formed on top of the flat surface. Thus, instead of lithographic patterning and etching individual top charge carrier control layers, a common top charge carrier control layer may be used.

It should be understood that in some situations individual top charge carrier control layers may be used.

Some photon absorbing materials may be particularly sensitive to lithographically related damage and/or etch related damage. Such materials may be PbS quantum dots, InAs quantum dots, and/or organic semiconductors. Thus, the first or second photon absorbing materials may comprise PbS quantum dots, InAs quantum dots, and/or an organic semiconductor. In this case, the potential benefits in terms of facilitating a high-quality of the multipixel detector may be particularly large.

As previously mentioned, the multipixel detector may comprise a CMOS circuit. For example, the bottom layer may comprise a complementary metal—oxide—semiconductor, CMOS, readout integrated circuit, wherein the CMOS readout integrated circuit comprises CMOS electronic circuits configured to convert an amount of charge carriers from the respective first and second TFPDs into respective electrical signals when the multipixel detector is in operation.

As previously mentioned, the first and second photon absorbing materials may be, or comprise, different materials, e.g. materials with different absorption peak wavelengths. Thus, an absorption peak wavelength of the first photon absorbing material is different from an absorption peak wavelength of the second photon absorbing material.

The absorption peak wavelength may be the wavelength at which photon absorption is strongest, e.g. the wavelength where the absorption coefficient of the photon absorbing material is largest.

When the first and second photon absorbing materials have different absorption peak wavelengths they may absorb photon in different wavelength bands. Thus, the multipixel detector may be seen as a multispectral detector, also known as a multispectral sensor.

The multispectral detector may comprise more than a first TFPD and a second TFPD. The multispectral detector may be configured to absorb photons in more than two different wavelength bands, e.g. more than 5 different wavelength bands, or more than 10 different wavelength bands. The multispectral detector may comprise an array of TFPDs. The array of TFPDs may be one-dimensional, e.g. comprise a single row of TFPDs, or two-dimensional, e.g. comprise rows and columns of TFPDs. The multispectral detector may be a multispectral imaging device.

For a multispectral detector it may be beneficial to perform at least some of the processing of TFPDs with different photon absorbing materials separately. For example, it may be beneficial to at least partially form a TFPD with one photon absorbing material before starting to process a TFPD with another photon absorbing material. Thus, the TFPDs that are formed first may be subjected to many iterations of lithographic patterning and therefore subjected to heat and/or radiation from the lithographic patterning process many times in conventional methods. Therefore, the use of planarization and a common top contact to reduce the number of lithographic patterning processes the photon absorbing materials of the TFPDs are subjected to may be particularly beneficial for a multispectral detector.

The method may comprise configuring the multipixel detector such that the first bottom electrode is arranged at a first distance from the common top electrode and the second bottom electrode is arranged at a second distance from the common top electrode, wherein the second distance is smaller than the first distance. Different distances between the common top electrode and the respective first and second bottom electrodes may be used to individually tune the absorption for the first and second TFPDs. This may be useful when the first and second photon absorbing materials are the same. It may be particularly useful when the first and second photon absorbing materials are different, e.g. when the first and second photon absorbing materials have different quantum efficiencies.

The method may comprise configuring the multipixel detector such that the first bottom electrode is arranged at a first distance from the common top electrode and the second bottom electrode is arranged at a second distance from the common top electrode, wherein the second distance is smaller than the first distance and wherein a quantum efficiency of the second photon absorbing material is larger than a quantum efficiency of the first photon absorbing material.

Thus, the larger quantum efficiency of the second photon absorbing material may be partially or fully compensated by the smaller distance between the second bottom contact and the common top contact, as compared to the distance between the first bottom contact and the common top contact. Thereby, the absorption for the first and second TFPDs may be tuned such that their saturation times are similar. Thus, a high-quality multispectral detector may be enabled. If the first and second TFPDs would have the same distance between the bottom contact and the common top contact but very different quantum efficiencies, one TFPD would saturate much faster than the other.

The method may further comprise depositing a sacrificial layer, wherein the sacrificial layer is deposited between the deposition of the first and second photon absorbing materials, such that the first and second photon absorbing materials are separated by the sacrificial layer; and removing the sacrificial layer in the planarization step.

Such a sacrificial layer may protect the photon absorbing material which is deposited first. For example, the photon absorbing material which is deposited first may be protected from intermixing with the photon absorbing material which is deposited later.

The sacrificial layer may be deposited after the deposition of the first photon absorbing material and before the forming of the second opening. Thus, the first photon absorbing material may be protected from etch related damage during etching of the second opening. The first photon absorbing material may also be protected from other damage during forming of the second opening.

The method may further comprise: planarizing, in an intermediate planarization step, the deposited electrically insulating layer and the deposited first photon absorbing material, wherein the intermediate planarization step is carried out after depositing the first photon absorbing material in the first opening, and before forming the second opening through the electrically insulating layer.

When the second opening is formed after depositing the first photon absorbing material in the first opening it may be beneficial to use an intermediate planarization step such that the patterning resolution for forming the second opening does not degrade due to an uneven surface or a surface that lies above the top surface of the electrically insulating layer.

The method may be configured such that the first opening is formed such that a top part of the first opening is larger than a bottom part of the first opening, whereby the first opening is tapered, and/or the second opening is formed such that a top part of the second opening is larger than a bottom part of the second opening, whereby the second opening is tapered.

A tapered opening makes it easier to fully fill the opening and avoid pockets without photon absorbing material in the opening.

BRIEF DESCRIPTION OF THE FIGURES

The above, as well as additional, features will be better understood through the following illustrative and non-limiting detailed description of example embodiments, with reference to the appended drawings.

FIG. 4a is part of a time sequence of illustrations showing a multipixel detector during production, according to an example.

FIG. 4b is part of a time sequence of illustrations showing a multipixel detector during production, according to an example.

FIG. 4c is part of a time sequence of illustrations showing a multipixel detector during production, according to an example.

FIG. 4d is part of a time sequence of illustrations showing a multipixel detector during production, according to an example.

FIG. 4e is part of a time sequence of illustrations showing a multipixel detector during production, according to an example.

FIG. 4f is part of a time sequence of illustrations showing a multipixel detector during production, according to an example.

FIG. 4g is part of a time sequence of illustrations showing a multipixel detector during production, according to an example.

FIG. 4h is part of a time sequence of illustrations showing a multipixel detector during production, according to an example.

FIG. 4i is part of a time sequence of illustrations showing a multipixel detector during production, according to an example.

FIG. 4j is part of a time sequence of illustrations showing a multipixel detector during production, according to an example.

FIG. 4k is part of a time sequence of illustrations showing a multipixel detector during production, according to an example.

FIG. 4l is part of a time sequence of illustrations showing a multipixel detector during production, according to an example.

FIG. 5a is part of a time sequence of illustrations showing a multipixel detector during production, according to an example.

FIG. 5b is part of a time sequence of illustrations showing a multipixel detector during production, according to an example.

FIG. 5c is part of a time sequence of illustrations showing a multipixel detector during production, according to an example.

FIG. 5d is part of a time sequence of illustrations showing a multipixel detector during production, according to an example.

FIG. 5e is part of a time sequence of illustrations showing a multipixel detector during production, according to an example.

FIG. 5f is part of a time sequence of illustrations showing a multipixel detector during production, according to an example.

FIG. 5g is part of a time sequence of illustrations showing a multipixel detector during production, according to an example.

FIG. 5h is part of a time sequence of illustrations showing a multipixel detector during production, according to an example.

FIG. 7a is part of a time sequence of illustrations showing a multipixel detector during production, according to an example.

FIG. 7b is part of a time sequence of illustrations showing a multipixel detector during production, according to an example.

FIG. 7c is part of a time sequence of illustrations showing a multipixel detector during production, according to an example.

FIG. 7d is part of a time sequence of illustrations showing a multipixel detector during production, according to an example.

FIG. 7e is part of a time sequence of illustrations showing a multipixel detector during production, according to an example.

FIG. 7f is part of a time sequence of illustrations showing a multipixel detector during production, according to an example.

FIG. 7g is part of a time sequence of illustrations showing a multipixel detector during production, according to an example.

FIG. 7h is part of a time sequence of illustrations showing a multipixel detector during production, according to an example.

FIG. 7i is part of a time sequence of illustrations showing a multipixel detector during production, according to an example.

FIG. 7j is part of a time sequence of illustrations showing a multipixel detector during production, according to an example.

FIG. 7k is part of a time sequence of illustrations showing a multipixel detector during production, according to an example.

FIG. 7l is part of a time sequence of illustrations showing a multipixel detector during production, according to an example.

All the figures are schematic, not necessarily to scale, and generally only show parts which are necessary to elucidate example embodiments, wherein other parts may be omitted or merely suggested.

DETAILED DESCRIPTION

Example embodiments will now be described more fully hereinafter with reference to the accompanying drawings. That which is encompassed by the claims may, however, be embodied in many different forms and should not be construed as limited to the embodiments set forth herein; rather, these embodiments are provided by way of example. Furthermore, like numbers refer to the same or similar elements or components throughout.

Figure 1:
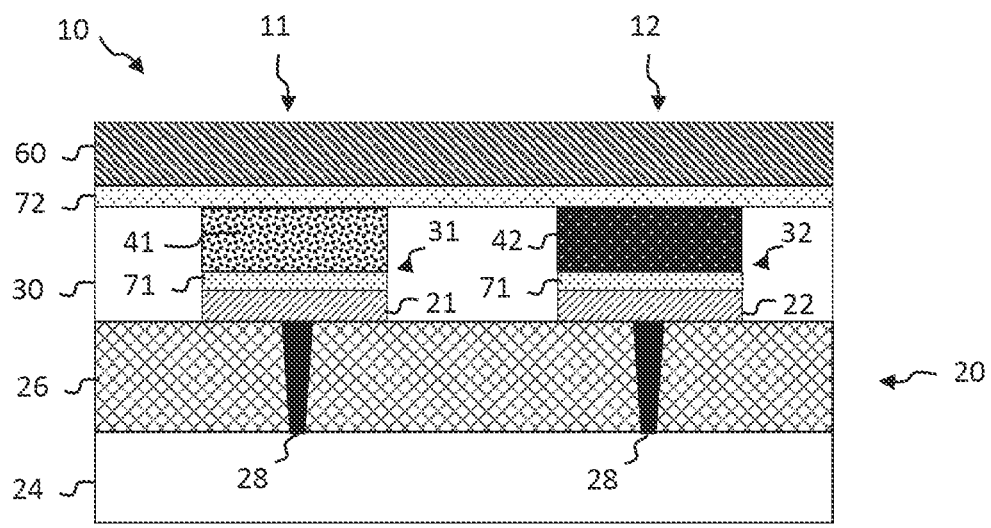
FIG. 1 illustrates a multipixel detector, according to an example.

FIG. 1 illustrates a multipixel detector 10 which may be produced according to the method 100 of the disclosure. The illustrated multipixel detector 10 has a bottom layer 20 comprising a CMOS readout integrated circuit 24, a first bottom electrode 21, and a second bottom electrode 22. The first bottom electrode 21 and the second bottom electrode 22 are arranged on a bottom insulator 26 on top of the CMOS readout integrated circuit 24 and connected to the CMOS readout integrated circuit 24 by via connections 28 going through the bottom insulator 26. The first bottom electrode 21 and the second bottom electrode 22 are embedded in an electrically insulating layer 30. A first opening 31 and a second opening 32 go through the electrically insulating layer 30 to the first bottom electrode 21 and the second bottom electrode 22 respectively. The first opening 31 is at least partially filled with a first photon absorbing material 41. Similarly, the second opening 32 is at least partially filled with a second photon absorbing material 42.

The first photon absorbing material 41 in the first opening 31 is electrically connected to the first bottom electrode 21 by a bottom charge carrier control layer 71 between the first photon absorbing material 41 and the first bottom electrode 21. Similarly, the second photon absorbing material 42 in the second opening 32 is electrically connected to the second bottom electrode 22 by a bottom charge carrier control layer 71 between the second photon absorbing material 42 and the second bottom electrode 22. Further, both the first photon absorbing material 41 and the second photon absorbing material 42 are electrically connected to a common top electrode 60 by a top charge carrier control layer 72 which in the illustration is a common top charge carrier control layer.

According to the above: the common top electrode 60, the first photon absorbing material 41 in the first opening 31, and the first bottom electrode 21 form parts of a first TFPD 11. Further, the common top electrode 60, the second photon absorbing material 42 in the second opening 32 and the second bottom electrode 22 form parts of a second TFPD 12.

In the following, examples of materials that may be used in the multipixel detector 10 will be given.

The first bottom electrode 21 and the second bottom electrode 22 may comprise metal, e.g. aluminium, copper, tantalum nitride, or titanium nitride.

The common top electrode 60 may be at least partially transparent. The common top electrode 60 may comprise indium tin oxide (ITO), indium gallium zinc oxide (IGZO), or graphene.

Examples of photon absorbing materials that may be used are PbS quantum dots, InAs quantum dots, and/or other quantum dots. The quantum dots may be colloidal quantum dots. Thus, a photon absorbing material may be a colloidal quantum dot thin film. Further examples of photon absorbing materials that may be used are organic semiconductors and/or perovskite material. The first photon absorbing material 41 and the second photon absorbing material 42 may be, or comprise, the same material. Alternatively, the first photon absorbing material 41 and the second photon absorbing material 42 may be, or comprise, different materials. For example, the first photon absorbing material 41 and the second photon absorbing material 42 may be materials with different absorption peak wavelengths. For example, the first photon absorbing material 41 may comprise one type of quantum dots and the second photon absorbing material 42 may comprise another type of quantum dots, such that the photon absorbing materials have different absorption peak wavelengths. Alternatively, the first photon absorbing material 41 and the second photon absorbing material 42 may comprise the same type of quantum dots where the quantum dots of the first photon absorbing material 41 have a different size compared to the quantum dots of the second photon absorbing material 42, such that the photon absorbing materials have different absorption peak wavelengths. Further, the first photon absorbing material 41 and the second photon absorbing material 42 may be materials of different types. For example, the first photon absorbing material 41 may comprise quantum dots and the second photon absorbing material 42 may comprise an organic semiconductor material.

A bottom charge carrier control layer 71 may comprise at least one of: an electron transport layer, a hole transport layer, an electron blocking layer, a hole blocking layer, an electron injection layer, or a hole injection layer.

Similarly, a top charge carrier control layer 72 may comprise at least one of: an electron transport layer, a hole transport layer, an electron blocking layer, a hole blocking layer, an electron injection layer, or a hole injection layer.

The bottom charge carrier control layer 71 and the top charge carrier control layer 72 may be configured to promote transport of opposite types of charge carriers. In one configuration, the bottom charge carrier control layer 71 is an electron transport layer and the top charge carrier control layer 72 is a hole transport layer. In another configuration, the bottom charge carrier control layer 71 is a hole transport layer and the top charge carrier control layer 72 is an electron transport layer.

Examples of an electron transport layer that may be used are $TiO_2$ and Niobium Oxide ($NbO_x$).

Examples of a hole transport layer that may be used are nickel oxide ($NiO_x$) and copper oxide ($CuO_x$).

The electrically insulating layer 30 may be silicon oxide, silicon nitride, or aluminum oxide.

Figure 3:
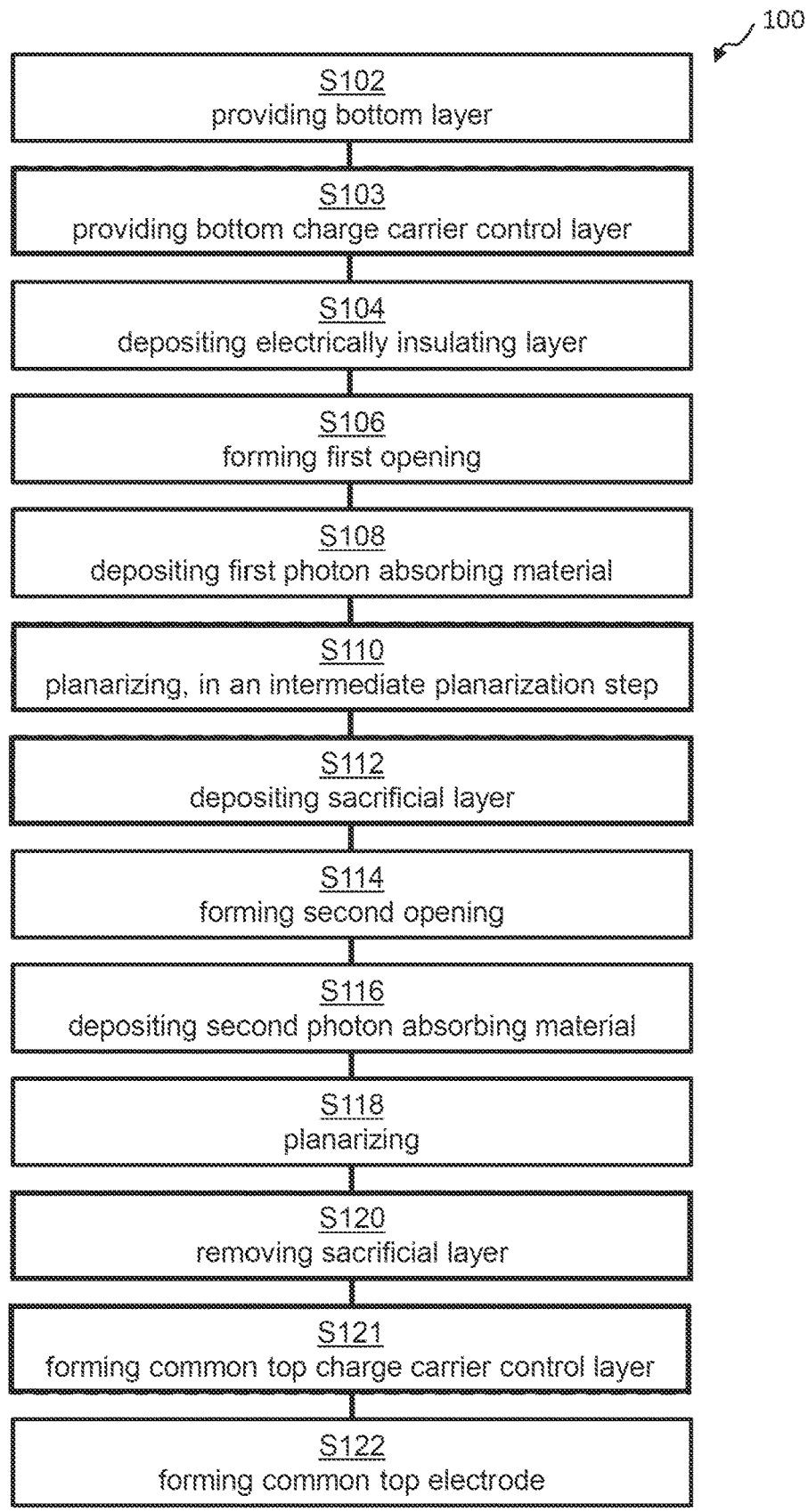
FIG. 3 is a flow chart of a method, according to an example.

FIG. 3 illustrates a flow chart of a method 100 for producing a multipixel detector, such as the multipixel detector 10 of FIG. 1. The method 100 will herein be described in conjunction with FIGS. 4a-l. FIGS. 4a-l show a time sequence of illustrations of the multipixel detector 10, seen in cross-section, during production according to the flow chart of FIG. 3. In the example given, all steps of the method 100 shown in FIG. 3 will be included.

A bottom layer 20 comprising a first bottom electrode 21 and a second bottom electrode 22 is provided S102, as illustrated in FIGS. 4a-c. FIGS. 4a-c illustrate how a bottom layer 20 may be manufactured. The first bottom electrode 21 and a second bottom electrode 22 may be arranged on a readout circuit. In FIG. 4 a CMOS readout integrated circuit 24 is used. The CMOS readout integrated circuit 24 is shown in FIG. 4a but excluded from FIGS. 4b-l for clarity. A bottom insulator 26 is arranged on top of the CMOS readout integrated circuit 24 and via connections 28 going through the bottom insulator 26 are formed, as shown in FIG. 4a. A layer of bottom electrode material may then be deposited on the bottom insulator 26 (comprising the via connections 28) followed by a bottom charge carrier control layer 71, as seen in FIG. 4b. Subsequently, the first bottom electrode 21 and the second bottom electrode 22 may be formed out of the layer of bottom electrode material e.g., by patterning and etching. The bottom charge carrier control layer 71 may simultaneously be patterned and etched. Thus, in the method 100 the bottom charge carrier control layers 71 on the first bottom electrode 21 and the second bottom electrode 22 are provided S103 before depositing S104 the electrically insulating layer 30, as shown in FIG. 4c. The electrically insulating layer 30 is subsequently deposited S104 on the bottom layer 20, as seen in FIG. 4d. The electrically insulating layer 30 may be a silicon oxide, silicon nitride, or aluminum oxide layer. The electrically insulating layer 30 may be deposited e.g., through physical vapor deposition, chemical vapor deposition, or spin-coating.

The electrically insulating layer 30 may then be planarized, as seen in FIG. 4e. Planarizing the electrically insulating layer 30 may improve the resolution of forthcoming patterning steps.

A first opening 31 through the electrically insulating layer 30 to the first bottom electrode 21 is then formed S106, as seen in FIG. 4f. The first opening 31 may be formed through patterning, e.g. lithographic patterning and etching.

A first photon absorbing material 41 is then deposited S108 in the first opening 31 to electrically connect to the first bottom electrode 21, as seen in FIG. 4g. The first photon absorbing material 41 may simultaneously be deposited on a top surface of the electrically insulating layer 30. The first photon absorbing material 41 may comprise PbS quantum dots, InAs quantum dots, other quantum dots, an organic semiconductor, and/or perovskite. The first photon absorbing material 41 may be deposited through e.g. spin coating, printing, physical vapor deposition, or evaporation.

FIG. 4h illustrates an intermediate planarization step wherein the deposited electrically insulating layer 30 and the deposited first photon absorbing material 41 are planarized S110. The intermediate planarization step may form a flat surface comprising a top surface of the electrically insulating layer 30 and a top surface of the first photon absorbing material 41 in the first opening 31.

FIG. 4i illustrates a step wherein a sacrificial layer 45 is deposited S112. In the illustrated example the sacrificial layer 45 is deposited S112 on the surface formed by the intermediate planarization step.

A second opening 32 through the electrically insulating layer 30 to the second bottom electrode 22 is then formed S114, as seen in FIG. 4j. The second opening 32 may be formed through patterning, e.g. lithographic patterning and etching.

A second photon absorbing material 42 is then deposited S116 in the second opening 32 to electrically connect to the second bottom electrode 22, as seen in FIG. 4k. The second photon absorbing material 42 may simultaneously be deposited on a top surface of sacrificial layer 45, as illustrated. Thus, the sacrificial layer 45 may separate the first photon absorbing material 41 and the second photon absorbing material 42. If a sacrificial layer 45 is not used, the second photon absorbing material 42 may simultaneously be deposited on a top surface of the electrically insulating layer 30.

The second photon absorbing material 42 may comprise PbS quantum dots, InAs quantum dots, other quantum dots, an organic semiconductor, and/or perovskite. The second photon absorbing material 42 may be deposited through e.g. spin coating, printing, evaporation, or physical vapor deposition.

The electrically insulating layer 30, the first photon absorbing material 41, and the second photon absorbing material 42 are then planarized S118 to form a flat surface 50, as seen in FIG. 4l. Thereby, in the example shown, the sacrificial layer 45 is also removed S120. The flat surface 50 comprises a top surface 56 of the electrically insulating layer 30, a top surface 51 of the first photon absorbing material 41 in the first opening 31, and a top surface 52 of the second photon absorbing material 42 in the second opening 32, separated from the top surface 51 of the first photon absorbing material 41 by the top surface 56 of the electrically insulating layer 30.

Any of the planarization steps described in the examples above and below may comprise chemical-mechanical polishing and/or grinding and/or fly-cutting.

Figure 2:
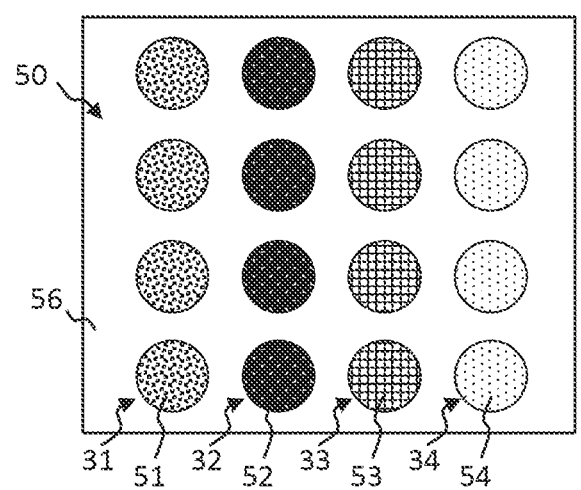
FIG. 2 illustrates a flat surface after planarization, according to an example.

FIG. 2 illustrates a top view of the flat surface 50, in this case from what is intended to be a multipixel device comprising a 4 by 4 array of TFPDs. Thus, in the flat surface 50 there can be seen a row comprising a first opening 31, a second opening 32, a third opening 33, and a fourth opening 34 which are respectively filled with a first photon absorbing material 41, a second photon absorbing material 42, a third photon absorbing material 43, and a fourth photon absorbing material 44. In FIG. 2 there are in total four rows which each may have the same combination of photon absorbing material as the previously described row, as illustrated. The flat surface 50 comprises a top surface 56 of the electrically insulating layer 30, a top surface 51 of the first photon absorbing material 41 in the first opening 31, and a top surface 52 of the second photon absorbing material 42 in the second opening 32, separated from the top surface 51 of the first photon absorbing material 41 by the top surface 56 of the electrically insulating layer 30. Further, each top surface of photon absorbing material in an opening is separated from the other top surfaces of photon absorbing material by the top surface 56 of the electrically insulating layer 30.

As seen in FIG. 4l, the sacrificial layer 45 may be removed S120 in the planarization step S118 or in conjunction with the planarization step S118.

As shown in FIG. 1, subsequently a top charge carrier control layer 72 may be formed S121. A common top electrode 60 is formed S122 that electrically connects to the top surface 51 and the top surface 52 of the first photon absorbing material 41 and the second photon absorbing material 42 in the flat surface 50. FIG. 1 may herein be seen as the finished multipixel detector 10 after depositing the top charge carrier control layer 72 and the common top electrode 60 on the flat surface 50 shown in FIG. 4l.

It should be understood that the steps of the method 100 may not necessarily be performed in the order described in conjunction with FIGS. 3-4. Further, in some instances some steps may be performed simultaneously. This is exemplified in FIGS. 5a-h which are a time sequence of illustrations showing a multipixel detector during production, wherein the first photon absorbing material 41 and the second photon absorbing material 42 of the multipixel detector comprises the same material.

FIG. 5a illustrates a bottom layer 20 comprising a first bottom electrode 21 and a second bottom electrode 22 being provided S102.

FIG. 5b illustrates an electrically insulating layer 30 being deposited S104 on the bottom layer 20.

FIG. 5c illustrates a planarization of the electrically insulating layer 30.

FIG. 5d illustrates the first opening 31 and the second opening 32 being formed S106, S114 through the electrically insulating layer 30 to the first bottom electrode 21 and the second bottom electrode 22, wherein the openings are formed simultaneously. For example, the first opening 31 and the second opening 32 may be defined in the same lithographic patterning step and/or etched simultaneously.

FIG. 5e illustrates that in this example the first photon absorbing material 41 and the second photon absorbing material 42 are the same material. FIG. 5e further illustrates the first photon absorbing material 41 and the second photon absorbing material 42 being deposited S108, S116. Thus, in this example the first photon absorbing material 41 and the second photon absorbing material 42 are deposited simultaneously.

FIG. 5f illustrates the electrically insulating layer 30, the first photon absorbing material 41, and the second photon absorbing material 42 after being planarized S118 to form a flat surface 50.

FIG. 5g illustrates a top charge carrier control layer 72 being formed S121.

FIG. 5h illustrates a common top electrode 60 formed S122 on top of the top charge carrier control layer 72. Thus, the common top electrode 60 is also formed S122 on top of the flat surface 50.

Figure 6:
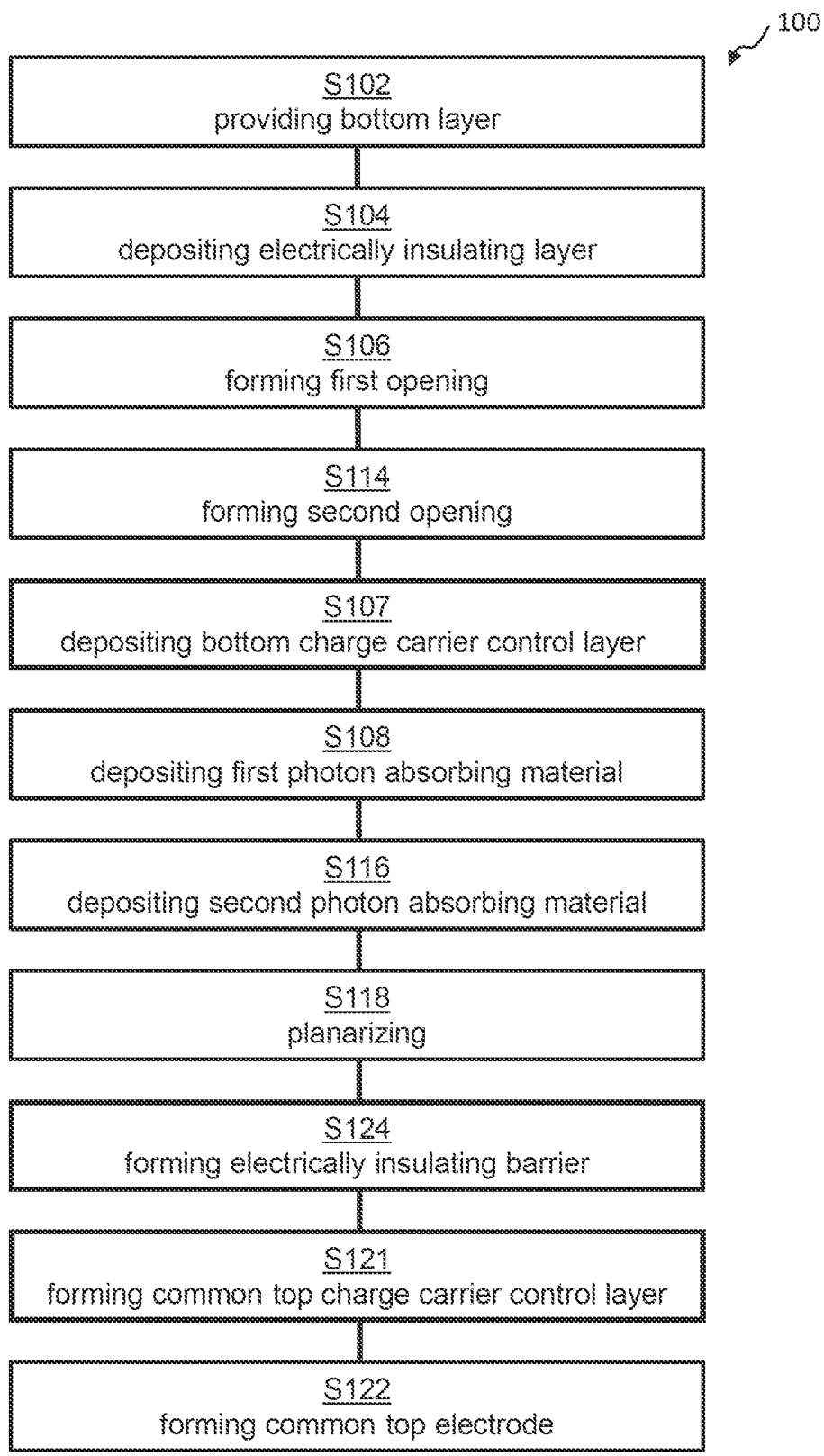
FIG. 6 is a flow chart of a method, according to an example.

In the above examples, a bottom charge carrier control layer 71 has been provided S103 on the first bottom electrode 21 and the second bottom electrode 22 before deposition S104 of the electrically insulating layer 30. Alternatively, or additionally, a bottom charge carrier control layer 71 may be deposited S107 in the first opening 31 before depositing S108 the first photon absorbing material 41 in the first opening 31 and/or a bottom charge carrier control layer 71 may be deposited S107 in the second opening 32 before depositing S116 the second photon absorbing material 42 in the second opening 32. This will be shown below in a method 100 according to the flow chart of FIG. 6. The method 100 will herein be described in conjunction with FIG. 7. FIGS. 7a-l show a time sequence of illustrations of the multipixel detector 10, seen in cross-section, during production according to the flow chart of FIG. 6. In the example given, the steps of the method 100 will be included. In the example, the first photon absorbing material 41 and the second photon absorbing material 42 are the same material. However, the exemplified method 100 is applicable also in the case when the first photon absorbing material 41 and the second photon absorbing material 42 are different materials as well as when the first opening 31 and second opening 32 opening are formed separately.

According to the illustrated method 100, a bottom layer 20 comprising a first bottom electrode 21 and a second bottom electrode 22 is provided S102, see FIG. 7c.

FIGS. 7a-c illustrate how a bottom layer 20 may be manufactured. The first bottom electrode 21 and a second bottom electrode 22 may be arranged on a readout circuit. In FIG. 7a a CMOS readout integrated circuit 24 is used. The CMOS readout integrated circuit 24 is shown in FIG. 7a but excluded from FIGS. 7b-l for clarity. A bottom insulator 26 is arranged on top of the CMOS readout integrated circuit 24 and via connections 28 going through the bottom insulator 26 are formed, as shown in FIG. 7a. A layer of bottom electrode material may be deposited on the bottom insulator 26, as shown in FIG. 7c. Subsequently, the first bottom electrode 21 and the second bottom electrode 22 may be formed out of the layer of bottom electrode material e.g. by patterning and etching the layers, as shown in FIG. 7c, whereby the bottom layer 20 is provided S102.

The electrically insulating layer 30 is subsequently deposited S104 on the bottom layer 20, as seen in FIG. 7d.

FIG. 7e illustrates a planarization of the electrically insulating layer 30.

FIG. 7f illustrates the first opening 31 and the second opening 32 being formed S106, S114 through the electrically insulating layer 30 to the first bottom electrode 21 and the second bottom electrode 22, wherein the openings are formed simultaneously. For example, the first opening 31 and the second opening 32 may be defined in the same lithographic patterning step and/or etched simultaneously.

Further, in this example a bottom charge carrier control layer 71 is deposited S107 in the first opening 31 and in the in the second opening 32, as seen in FIG. 7g. In this example, it is the bottom charge carrier control layer 71 which is simultaneously deposited into both openings. The bottom charge carrier control layer 71 may conformally coat the surface, i.e., it may be deposited by a conformal coating technique. Thus, the first bottom electrode 21 and the second bottom electrode 22 as well as the side walls of the first opening 31 and the second opening 32 may be covered by the bottom charge carrier control layer 71, as illustrated. The surface may then be planarized, as seen in FIG. 7h.

FIG. 7i illustrates that in this example the first photon absorbing material 41 and the second photon absorbing material 42 are the same material. FIG. 7i further illustrates the structure after deposition S108, S116 of the first photon absorbing material 41 and the second photon absorbing material 42, in this example being the same material, and planarization S118 to form a flat surface 50. After planarization S118 a part 74 of the bottom charge carrier control layer 71 may lie within the flat surface 50. If a top charge carrier control layer 72 and/or a common top electrode 60 would be formed on top of the part 74 of the bottom charge carrier control layer 71 a defective pixel could be formed. This may e.g. be avoided by the formation of an electrically insulating barrier 46.

In this example, an electrically insulating barrier 46 is formed S124 on the flat surface 50, as seen in FIG. 7j. An electrically insulating barrier material may be deposited as a layer and patterned and etched to form opening to the first photon absorbing material 41 and the second photon absorbing material 42, as also seen in FIG. 7j. The patterning may be such that the part 74 of a bottom charge carrier control layer 71 lying within the flat surface 50 is covered.

FIG. 7k illustrates a top charge carrier control layer 72 being formed S121.

FIG. 7l illustrates a common top electrode 60 formed S122 on top of the top charge carrier control layer 72. Thus, the common top electrode 60 is also formed S122 on top of the flat surface 50.

Figure 8:
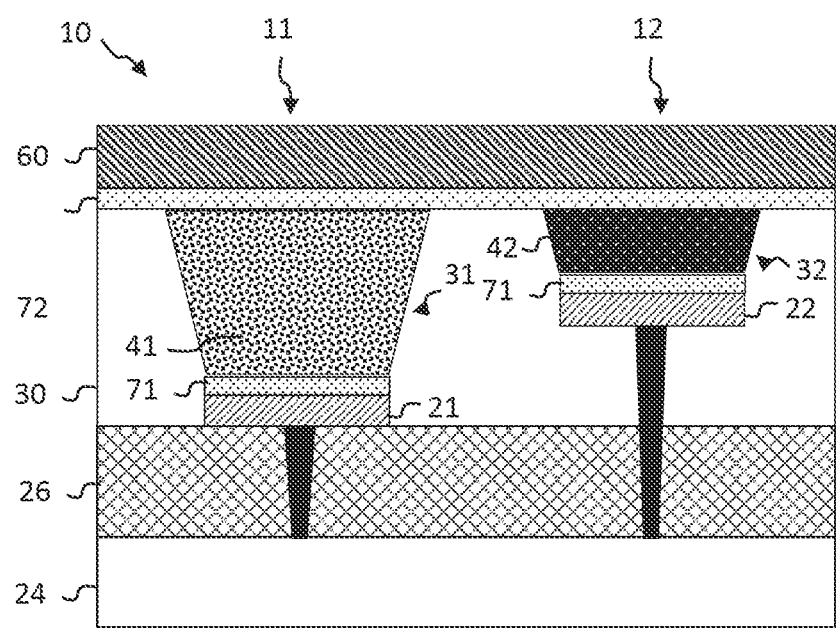
FIG. 8 illustrates a multipixel detector, according to an example.

FIG. 8 illustrates a multipixel detector wherein the first bottom electrode 21 is arranged at a first distance from the common top electrode 60 and the second bottom electrode 22 is arranged at a second distance from the common top electrode 60, wherein the second distance is smaller than the first distance. Herein the quantum efficiency of the second photon absorbing material 42 may be larger than the quantum efficiency of the first photon absorbing material 41. The first bottom electrode 21 and the second bottom electrode 22 with different height may be implemented in any of the above given examples. FIG. 8 further illustrates the first opening 31 and the second opening 32 being tapered. Tapered openings may be implemented in any of the above given examples.

It should be understood that the method 100 may comprise further steps than the ones described above. For example, after forming the common top electrode 60, the multipixel detector may be further processed to form a focal plane array.

While some embodiments have been illustrated and described in detail in the appended drawings and the foregoing description, such illustration and description are to be considered illustrative and not restrictive. Other variations to the disclosed embodiments can be understood and effected in practicing the claims, from a study of the drawings, the disclosure, and the appended claims. The mere fact that certain measures or features are recited in mutually different dependent claims does not indicate that a combination of these measures or features cannot be used. Any reference signs in the claims should not be construed as limiting the scope.

What is claimed is:

1. A method for producing a multipixel detector, the method comprising:
   providing a bottom layer comprising a first bottom electrode and a second bottom electrode;
   depositing an electrically insulating layer on the bottom layer;
   forming a first opening through the electrically insulating layer to the first bottom electrode;
   depositing a first photon absorbing material in the first opening to electrically connect to the first bottom electrode;
   forming a second opening through the electrically insulating layer to the second bottom electrode;
   depositing a second photon absorbing material in the second opening to electrically connect to the second bottom electrode;
   planarizing the electrically insulating layer, the first photon absorbing material, and the second photon absorbing material to form a flat surface, wherein the flat surface comprises a top surface of the electrically insulating layer, a top surface of the first photon absorbing material in the first opening, and a top surface of the second photon absorbing material in the second opening separated from the top surface of the first photon absorbing material by the top surface of the electrically insulating layer; and
   forming a common top electrode on top of the flat surface, wherein the common top electrode electrically connects to the top surfaces of the first photon absorbing material and the second photon absorbing material on the flat surface,
   wherein the common top electrode, the first photon absorbing material in the first opening, and the first bottom electrode form parts of a first thin film photodiode (TFPD), and wherein the common top electrode, the second photon absorbing material in the second opening, and the second bottom electrode form parts of a second TFPD.

2. The method according to claim 1, wherein the first TFPD comprises a bottom charge carrier control layer between the first photon absorbing material and the first bottom electrode and a top charge carrier control layer between the first photon absorbing material and the common top electrode.

3. The method according to claim 2, wherein the second TFPD comprises the bottom charge carrier control layer between the second photon absorbing material and the second bottom electrode and the top charge carrier control layer between the second photon absorbing material and the common top electrode.

4. The method according to claim 3, wherein each of the bottom charge carrier control layer and the top charge carrier control layer comprises an electron transport layer, a hole transport layer, an electron blocking layer, a hole blocking layer, an electron injection layer, or a hole injection layer.

5. The method according to claim 4, wherein the method comprises:
depositing the bottom charge carrier control layer in the first opening before depositing the first photon absorbing material in the first opening, such that the first bottom electrode and side walls of the first opening are covered by the bottom charge carrier control layer.

6. The method according to claim 5, further comprising depositing the bottom charge carrier control layer in the second opening before depositing the second photon absorbing material in the second opening, such that the second bottom electrode and side walls of the second opening are covered by the bottom charge carrier control layer.

7. The method according to claim 5, wherein the method comprises
forming an electrically insulating barrier on the flat surface formed by planarizing the electrically insulating layer, the first photon absorbing material, and the second photon absorbing material, the electrically insulating barrier covering a part of the bottom charge carrier control layer deposited in the first opening or the second opening, wherein the part of the bottom charge carrier control layer lies within the flat surface.

8. The method according to claim 3, wherein the method comprises:
providing the bottom charge carrier control layer on the first bottom electrode before depositing the electrically insulating layer.

9. The method according to claim 8, further comprising providing the bottom charge carrier control layer on the second bottom electrode before depositing the electrically insulating layer.

10. The method according to claim 3, wherein the method comprises:
forming a common top charge carrier control layer configured such that the common top electrode electrically connects to the top surfaces of the first photon absorbing material and the second photon absorbing material in the flat surface via the common top charge carrier control layer, wherein the common top charge carrier control layer is formed after planarizing the electrically insulating layer, the first photon absorbing material, and the second photon absorbing material.

11. The method according to claim 1, wherein planarizing the electrically insulating layer, the first photon absorbing material, and the second photon absorbing material comprises chemical-mechanical polishing, grinding, and/or fly-cutting.

12. The method according to claim 1, wherein the first photon absorbing material or the second photon absorbing material comprises PbS quantum dots, InAs quantum dots, and/or an organic semiconductor.

13. The method according to claim 1, wherein the bottom layer further comprises a complementary metal-oxide-semiconductor, (CMOS) readout integrated circuit, wherein the CMOS readout integrated circuit comprises CMOS electronic circuits configured to convert an amount of charge carriers from the first TFPD and the second TFPD into electrical signals.

14. The method according to claim 1, wherein a first absorption peak wavelength of the first photon absorbing material is different from a second absorption peak wavelength of the second photon absorbing material.

15. The method according to claim 1, wherein the first bottom electrode is arranged at a first distance from the common top electrode and the second bottom electrode is arranged at a second distance from the common top electrode, wherein the second distance is smaller than the first distance.

16. The method according to claim 15, wherein a quantum efficiency of the second photon absorbing material is larger than a quantum efficiency of the first photon absorbing material.

17. The method according to claim 1, further comprising:
depositing a sacrificial layer between deposition of the first photon absorbing material and deposition of the second photon absorbing material, such that the first photon absorbing material and the second photon absorbing material are separated by the sacrificial layer,
wherein planarizing the electrically insulating layer comprises removing the sacrificial layer.

18. The method according to claim 1, further comprising:
planarizing, in an intermediate planarization step, the electrically insulating layer and the first photon absorbing material, wherein the intermediate planarization step is carried out after depositing the first photon absorbing material in the first opening, and before forming the second opening through the electrically insulating layer.

19. The method according to claim 1, wherein
the first opening is formed such that a top part of the first opening is larger than a bottom part of the first opening, whereby the first opening is tapered.

20. The method according to claim 19, wherein the second opening is formed such that a top part of the second opening is larger than a bottom part of the second opening, whereby the second opening is tapered.

* * * * *